United States Patent
Koo (10) Patent No.: US 8,329,055 B2
(45) Date of Patent: Dec. 11, 2012

(54) PLASMA UNIFORMITY CONTROL USING BIASED ARRAY

(75) Inventor: Bon-Woong Koo, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1002 days.

(21) Appl. No.: 12/244,017

(22) Filed: Oct. 2, 2008

(65) Prior Publication Data

US 2010/0084980 A1    Apr. 8, 2010

(51) Int. Cl.
*C03C 15/00*    (2006.01)

(52) U.S. Cl. ..................... 216/71; 315/111.21

(58) Field of Classification Search ............ 315/111.21, 315/111.11, 111.41; 216/71; 118/723 AN, 118/723 E, 723 I, 728
See application file for complete search history.

(56) References Cited

U.S. PATENT DOCUMENTS

| | | | |
|---|---|---|---|
| 7,909,961 B2 * | 3/2011 | Kumar et al. | 156/345.3 |
| 2005/0241767 A1 * | 11/2005 | Ferris et al. | 156/345.35 |
| 2006/0000802 A1 * | 1/2006 | Kumar et al. | 216/67 |
| 2006/0000805 A1 * | 1/2006 | Todorow et al. | 216/68 |
| 2007/0017898 A1 * | 1/2007 | Kumar et al. | 216/67 |
| 2008/0099431 A1 * | 5/2008 | Kumar et al. | 216/44 |
| 2008/0101978 A1 * | 5/2008 | Ryabova et al. | 419/54 |

\* cited by examiner

*Primary Examiner* — Thuy Vinh Tran (57) ABSTRACT

Apparatus and method for improving the plasma uniformity in a plasma based system are described. The apparatus may include a plurality of electrical conductors, to which one or more types of electrical potentials may be applied. The conductors may be arranged in an array and may preferably be positioned near the plasma. By applying the bias voltages to the various electrically conductors, the plasma can be manipulated. For example, the conductors may extract or confine the electrons in the plasma, thereby locally adjusting the plasma density near the conductors. In the process, uniformity of the plasma density or ion concentration in the plasma may be improved. In a further embodiment, a magnetic field is included in the same direction as the electric field created by the bias voltage so as to better confine the charged particles.

10 Claims, 7 Drawing Sheets

PLASMA UNIFORMITY CONTROL USING BIASED ARRAY

BACKGROUND OF THE INVENTION

Ions are commonly implanted into a substrate in ion implantation processes to produce semiconductor devices. These ion implantations may be achieved in a number of different ways. For example, a beam-line ion implantation system may be used to perform the ion implantation process. In the beam-line ion implantation system, an ion source is used to generate ions, which are manipulated in a beam-like state, and then directed toward the wafer. As the ions strike the wafer, they dope a particular region of the wafer. The configuration of doped regions defines their functionality, and through the use of conductive interconnects, these wafers can be transformed into complex circuits.

Figure 1:
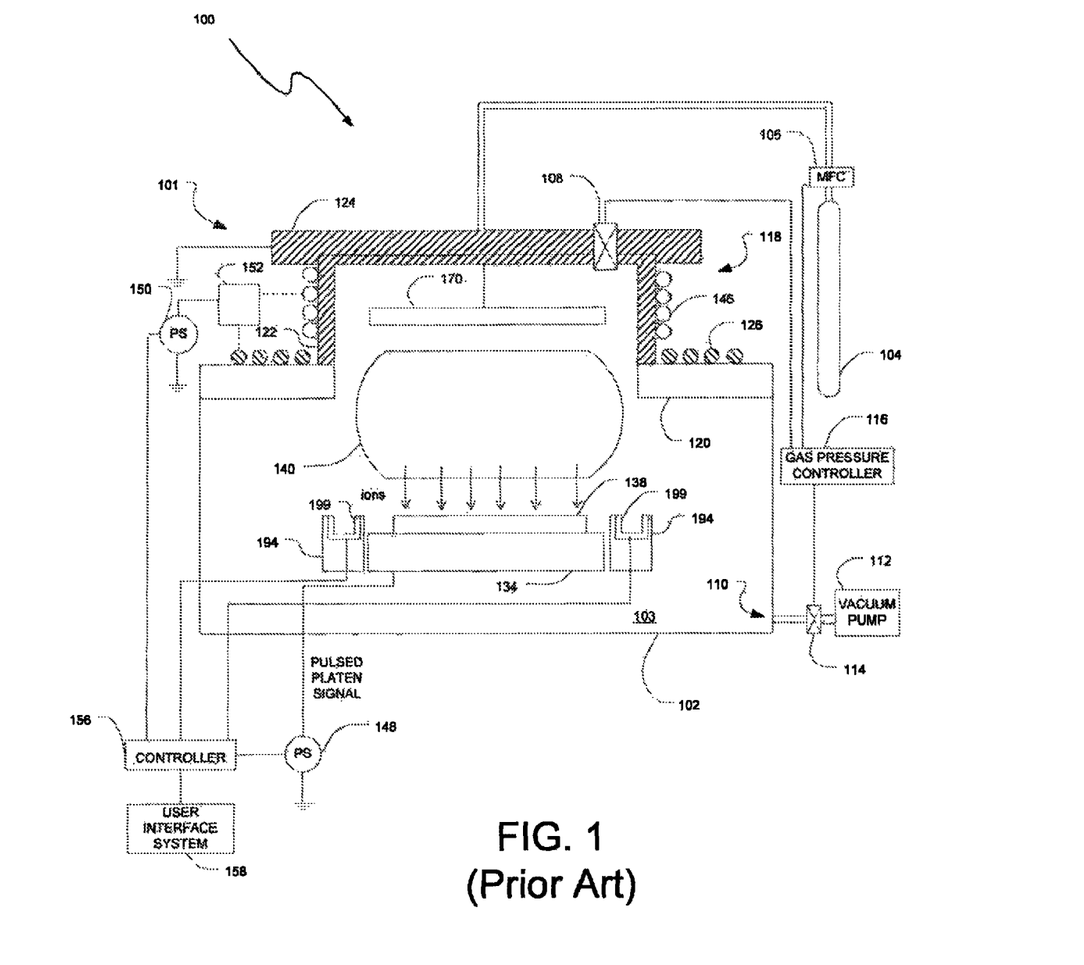
FIG. 1 represents a traditional plasma doping system.

In another example, a plasma containing ions may be generated near the substrate. A voltage is then applied to the substrate to attract ions toward the substrate. This technique is known as plasma doping ("PLAD") or plasma immersion ion implantation ("PIII") process. FIG. 1 shows an exemplary plasma doping system 100. The plasma doping system 100 includes a process chamber 102 defining an enclosed volume 103. Within the volume 103 of the process chamber 102, a platen 134 and a workpiece 138, which is supported by the platen 134, may be positioned.

A gas source 104 provides a dopant gas to the interior volume 103 of the process chamber 102 through the mass flow controller 106. A gas baffle 170 is positioned in the process chamber 102 to deflect the flow of gas from the gas source 104.

The process chamber 102 may also have a chamber top 118 having a dielectric section extending in a generally horizontal direction and another dielectric section extending in a generally vertical direction.

The plasma doping system may further include a plasma source 101 configured to generate a plasma 140 within the process chamber 102. The source 101 may include a RF power source 150 to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma doping system 100 also may include a bias power supply 148 electrically coupled to the platen 134. The bias power supply 148 may provide a continuous or a pulsed platen signal having pulse ON and OFF time periods to bias the workpiece 138. In the process, the ions may be accelerated toward the workpiece 138. The bias power supply 148 may be a DC or an RF power supply.

In operation, the gas source 104 supplies a dopant gas containing a desired dopant species to the chamber 102. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 148 provides a pulsed platen signal to bias the platen 134 and, hence, the workpiece 138 to accelerate ions from the plasma 140 toward the workpiece 138. The frequency of the pulsed platen signal and/or the duty cycle of the pulses may be selected to provide a desired dose rate.

The above technique is known to provide high implant throughput. However, the uniformity of the dose is difficult to control. In the beam-line ion implantation system, components such mass analyzer magnets, deceleration electrodes and other beam-line components may be used to manipulate ions into a uniform ion beam, and the workpiece may be uniformly implanted with ions in the uniform ion beam. Such components, however, are not available with a plasma doping system. To uniformly implant the workpiece in the plasma doping system, the plasma generated near the substrate should be uniform, as PLAD implant uniformity is closely related to plasma uniformity.

Figure 4:
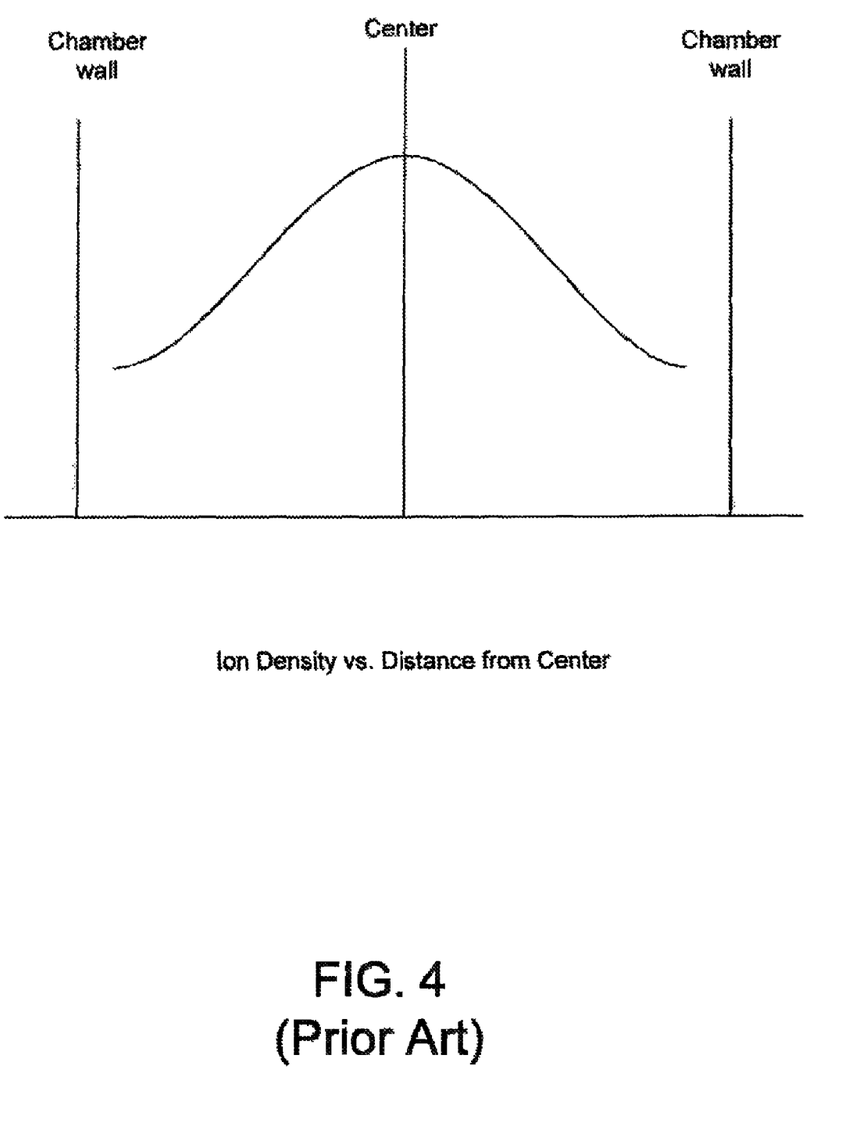
FIG. 4 represents a graph illustrating typical ion density profile in a plasma tool.

In a typical plasma based system, the generated plasma is typically non-uniform; the plasma density is typically higher in the center of the plasma than near the chamber walls, as shown in FIG. 4. As a result, implant profile on the workpiece shows a similar non-uniform profile—higher implant dose in the middle, and lower dose in the edges of the workpiece. Typically, RF power, gas flow and distribution, magnetic confinements, etc. may be adjusted to improve the plasma uniformity. However, such techniques may mitigate the plasma non-uniformity, but cannot change the generic non-uniform density profile shown in FIG. 4.

As such, systems and methods to improve the uniformity of the plasma in a plasma based system are needed.

SUMMARY OF THE INVENTION

To overcome the disadvantages of the prior art, an apparatus and method for improving the uniformity of the plasma in a plasma based system are described. The apparatus may include a plurality of electrical conductors, to which a plurality of electrical potentials can be applied. In one embodiment, the conductors are arranged in a two dimensional array. In another embodiment, the conductors are arranged as a set of concentric rings. This apparatus may be located within the plasma based system, preferably positioned above the workpiece so that the plasma is located between it and the workpiece or substrate. Alternatively, the apparatus may be located to the side of the plasma. By applying bias voltages to the one or more conductors, the plasma density may be controlled. For example, a positively bias voltage may be applied to at least one of the conductors, and one or more conductors may attract the electrons from the plasma, thereby reducing the local plasma density proximate the conductor. In contrast, a negatively bias voltage may be applied to one or more conductors and one or more conductors may confine the electrons to reshape the plasma boundary proximate one or more conductors. By properly adjusting the polarity, magnitude and duration of the bias voltages applied to one or more conductors, the ion uniformity within the plasma can be controlled.

In a further embodiment, a magnetic field is included in the same direction as the electric field created by the bias voltage so as to better confine the charged particles.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF THE INVENTION

Herein, several embodiments of an apparatus and method for achieving uniform plasma density are disclosed with reference to accompanying drawings. The detailed disclosure contained herein is intended for illustration, for better understanding the disclosure, and not a limitation thereto. For example, the disclosure may be made with reference to a plasma doping or a plasma immersion ion implantation system. However, the present disclosure may be equally applicable to other plasma based systems including plasma based etching and deposition systems.

As described above, a plasma doping system is used to create a plasma in close proximity to the workpiece. The workpiece may be then biased to a certain electrical potential. However, the plasma density or the ion concentration within the generated plasma may be non-uniform. Typically, the concentration of ions is the highest near the center and lower near the chamber wall, as shown in FIG. 4.

In a plasma based system that is radially symmetric, the ion diffusion pattern may also be radially symmetric along the horizontal direction. As such, the plasma generated in a radially symmetric plasma based system may have approximately concentric density profile. Ion concentration at a point removed from the center of the plasma may be approximately the same as another point equidistanced from the center. Such a characteristic in symmetric plasma based system may result in a dome shaped plasma density profile.

Figure 2:
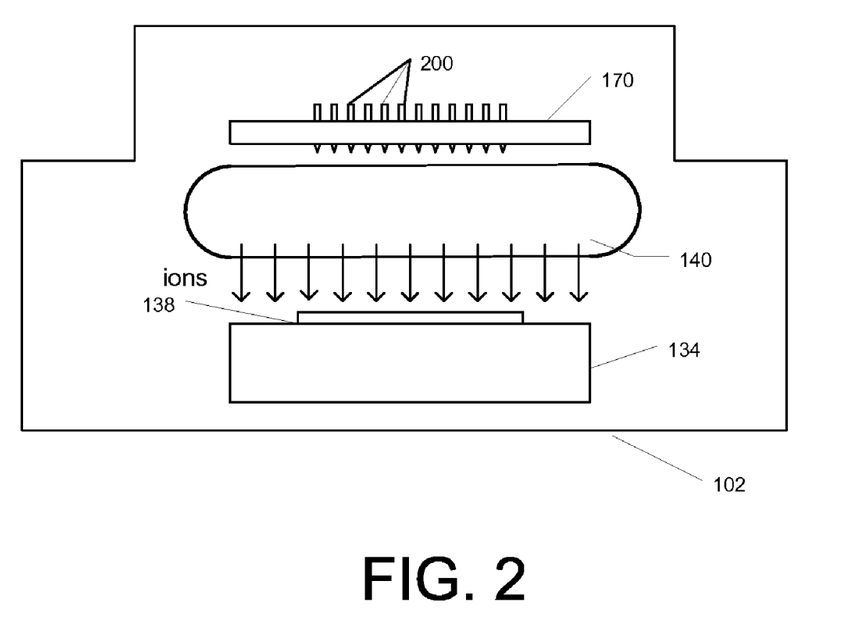
FIG. 2 represents a first embodiment of the apparatus of the present disclosure.

Plasma is a quasi-neutral state where positively and negative charged particles show collective behaviors. Charged particles in the plasma are responsive to both electrical and magnetic fields. By using these fields to manipulate the local distribution of the charged particles within the plasma, the implant uniformity can be improved. FIG. 2 represents a first embodiment of the apparatus. In this figure, many of the components in the plasma doping system of FIG. 1 have not been included in FIG. 2 for purpose of clarity and simplicity. However, it should be understood that the components shown in FIG. 1 may also be in the plasma doping system.

Referring to both FIGS. 1 and 2, the plasma 140 may be positioned between the workpiece 138 and the baffle 170. The baffle 170 can be a stationary baffle 170 and/or adjustable baffle 170. The adjustable baffle 170 can move in a vertical direction (up and down) relative to the wafer or the chamber ceiling. This movement may occur prior to and/or during wafer processing. Periodic pulses of bias voltage at the workpiece may be applied to accelerate ions toward the workpiece. However, as seen in FIGS. 1 and 2, there are no mechanisms to confine the plasma or control its uniformity. In one embodiment, a set of electrical conductors 200 is preferably located on the underside of the baffle 170 such that the conductors 200 may be positioned above the plasma. These conductors may preferably be electrically insulated from one another and from the baffle. For example, an insulating material (not shown) may separate the conductors 200 from one another and from the baffle 170. In another embodiment, the electrical conductors 200 may be disposed around the plasma (e.g. the side of the plasma). Yet in another embodiment, a set of electrical conductors 200 may be disposed above the plasma and another set of electrical conductors 200 may be disposed around the plasma.

Figure 3:
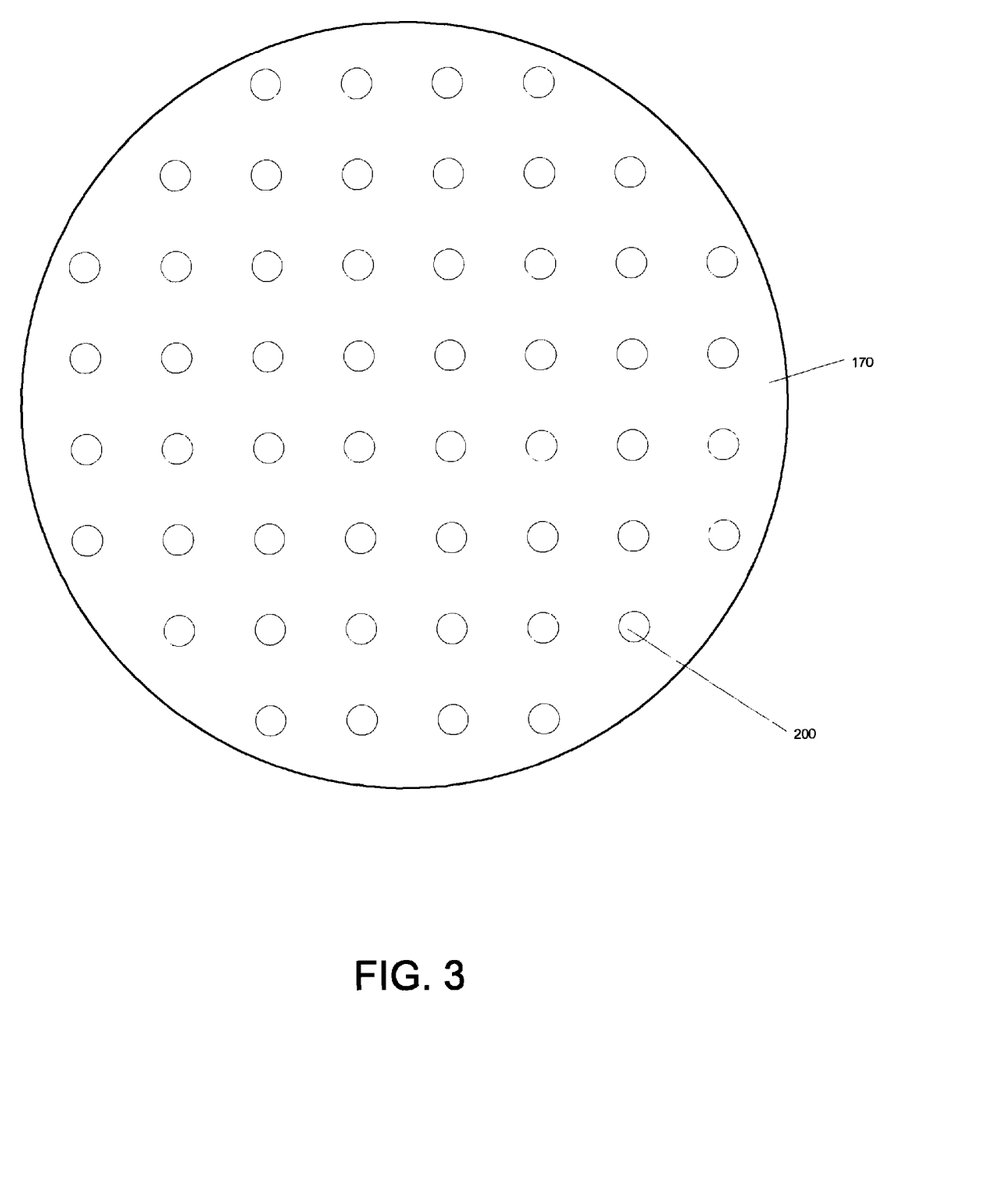
FIG. 3 represents a top view of the apparatus shown in FIG. 2.

In the present embodiment, the electrical conductors 200 may be pins 200. However, those or ordinary skill in the art will recognize that the electrical conductors 200 may be other types of conductor 200. In addition, the electrical conductors may have diameters of other values. In the present embodiment, the pins 200 may preferably be arranged in a two-dimensional array, as shown in FIG. 3.

In a plasma doping system, the plasma may have a cylindrical shaped volume, having a diameter of about 50 cm and a height of about 10-20 cm. Thus, if the two-dimensional array is to extend over the plasma region, and the distance between adjacent pins is about 1.0 cm, then the array may contain about 304 pins. However, those of ordinary skill in the art will recognize that the number of the pins in the array may be more or less. For example, if the array of the pins covers the 300 mm wafer region with the distance between adjacent pins of 2.54 cm, then the array would contain only about 110 pins.

Additionally, the electrical conductors can be various shapes including rectangular, square, round or other shapes. The most preferred shapes include (1) a flat cylindrical shape (0.1-1.0 cm in diameter) and (2) a pointed-tip cylindrical shape (0.05 cm or less in diameter for pointed tip, 0.1-1.0 cm in diameter for the pin body). For the latter case, the total angle of the pointed-tip may be less than 90 degrees.

Each of these pins may be independently controlled. For example, each pin may be biased to a voltage independent of other pins. Furthermore, each pin may be biased either positively or negatively. Finally, these bias voltages may be constant, or pulsed. In addition, the bias voltages may vary between conductors. Furthermore, the magnitude of the bias voltage at a particular conductor may vary over time. Thus, the two-dimensional array may be used to create any desired electrical field, and that field can be static or may vary.

By creating an electrical field potential above the plasma, the ion concentration within the plasma can be altered. For example, the use of a positive bias voltage will draw the electrons within the plasma toward those positively biased pins. The magnitude of that bias voltage may determine the size of the affected field. By drawing the electrons toward the upper portion of the plasma, the positive ions may disperse due to space charge effects. Such a dispersion of the positive ions may change the positive ion distribution within the plasma. Therefore, the dispersion may locally lower the concentration of implanted ions when the substrate bias voltage is applied. Negative bias voltages on the pins may have different effect. The negative voltage may repel the electrons and thereby cause the plasma to be locally compressed. This compression increases the local concentration of positive ions near the workpiece.

FIG. 4 shows a typical graph of the ion concentration as compared to the distance from the center of the system along one axis. Although this shows ion concentration versus distance in one dimension, similarly shaped graphs exist in all dimensions. Thus, by applying positive bias voltage near the center of the system, the ion concentration can be lowered, thereby improving uniformity. Additionally, applying negative bias voltage near the outer portions of the plasma compresses the plasma, and therefore effectively increases its concentration, further improving uniformity.

Figure 7:
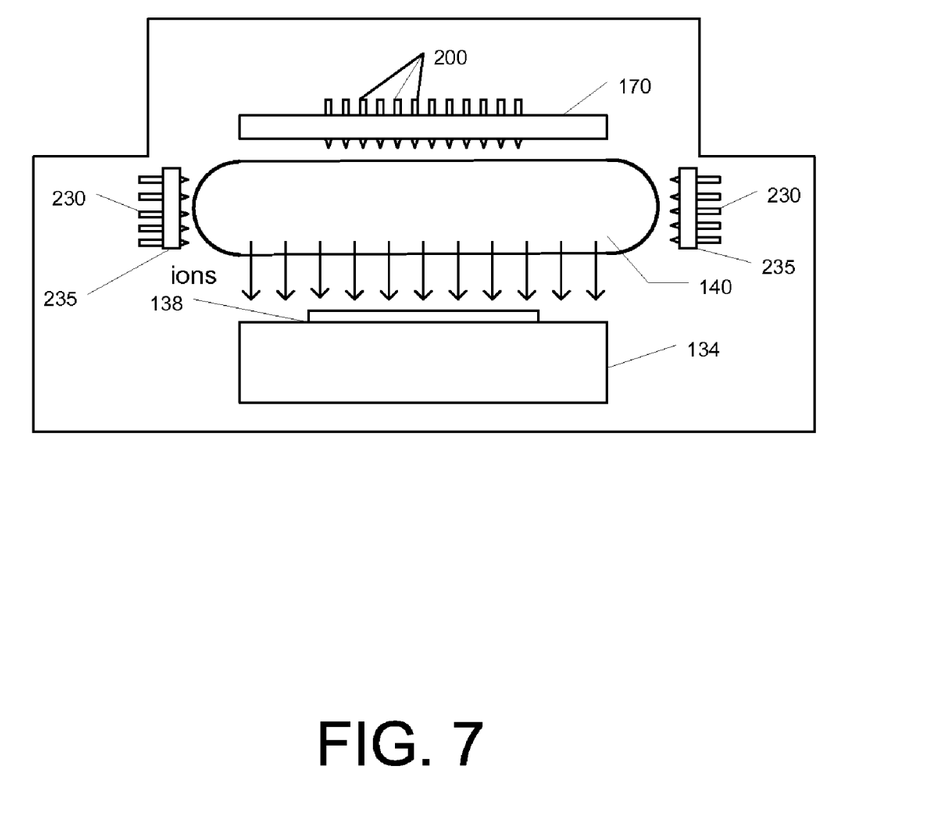
FIG. 7 represents a further embodiment of the apparatus of FIG. 2.

Furthermore, electrical conductors 230 may be placed vertically around the sides of the plasma, as shown in FIG. 7. Side baffles 235 are positioned about the sides of the plasma.

A set of electrical conductors 230 is preferably located on the side of the side baffle 235. These conductors 230 are electrically insulated from one another and from the side baffle 235. Such a configuration may serve to better confine the plasma.

As noted above, the bias voltage applied to one or more pins may be constant (DC) or intermittent, such as pulsed. Additionally, the pulsed bias voltage may be positive or negative. Alternatively, the one or more pins may be floated or grounded, as desired. Applying the pulsed bias voltages to the pins has certain advantages over DC bias. Since the plasma electrons are sensitive to the positive bias voltages, DC bias may cause too much perturbation to the plasmas, such as causing plasma instability or redistribution of the plasma in some applications. In such cases, pulsed bias with small duty cycle (50% or less) can minimize the plasma perturbation while providing controllability of the plasma uniformity. The duration of each pulse may preferably be between microseconds and milliseconds in the order of magnitude.

As noted above, the bias voltage applied to one or more electrical conductors 200 may be positive or negative. Alternatively, one or more electrical conductors may be grounded or floated. If biased, the bias voltage may be a constant voltage, or varying. In certain embodiments, the bias voltage is a periodic waveform having a duty cycle. This duty cycle can be between microseconds and milliseconds in order of magnitude. Furthermore, the duty cycle can vary, such that the duration of the pulses can change based on the plasma density and the desired density. Thus, bias voltage waveform may change in duration, frequency, magnitude, duty cycle or polarity over time.

Although each pin maybe independently controlled, groups of pins can be grouped together in one or more groups, and different groups may be controlled independently of other groups. For example, pins removed from the center by the same distance may be controlled together if the density profile of the non-uniform plasma is radially symmetric. However, if the plasma density is asymmetric, each pin or each group of pins may be controlled independently.

Figure 5:
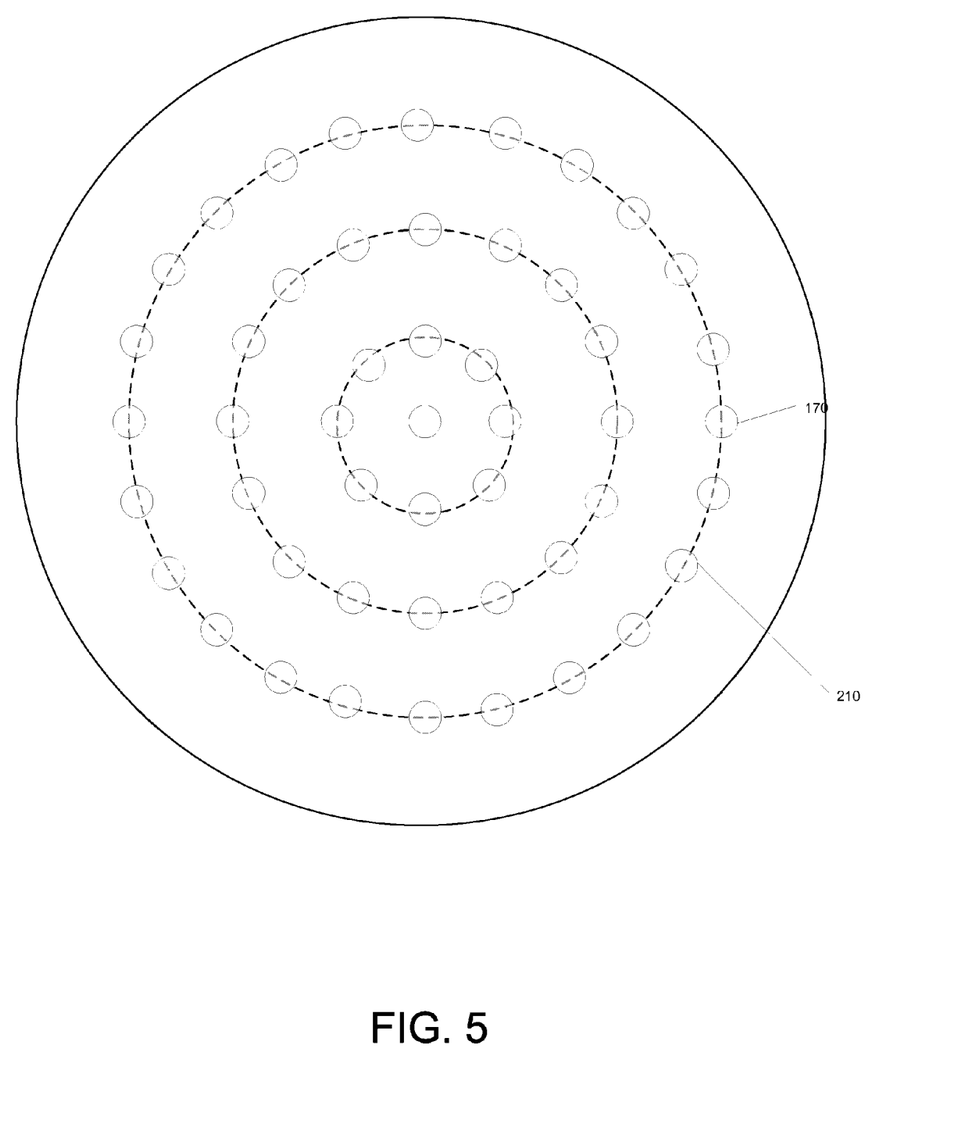
FIG. 5 represents a top view of a second embodiment of the apparatus of the present disclosure.

While the disclosure describes an array of pins as shown in FIG. 3, other embodiments are possible and within the scope of the disclosure. For example, another embodiment of the electrical biased elements is shown in FIG. 5. In this Figure, it is assumed that the plasma is symmetrical and therefore, the ion concentrations at a same distance from the center are all identical. Each concentric ring represents a set of electrically conductive elements 210, which can be biased independently of the adjacent rings. Thus, the same effect is desired, and therefore the same bias voltage can be applied. Other embodiments are also within the scope of the disclosure.

Figure 6:
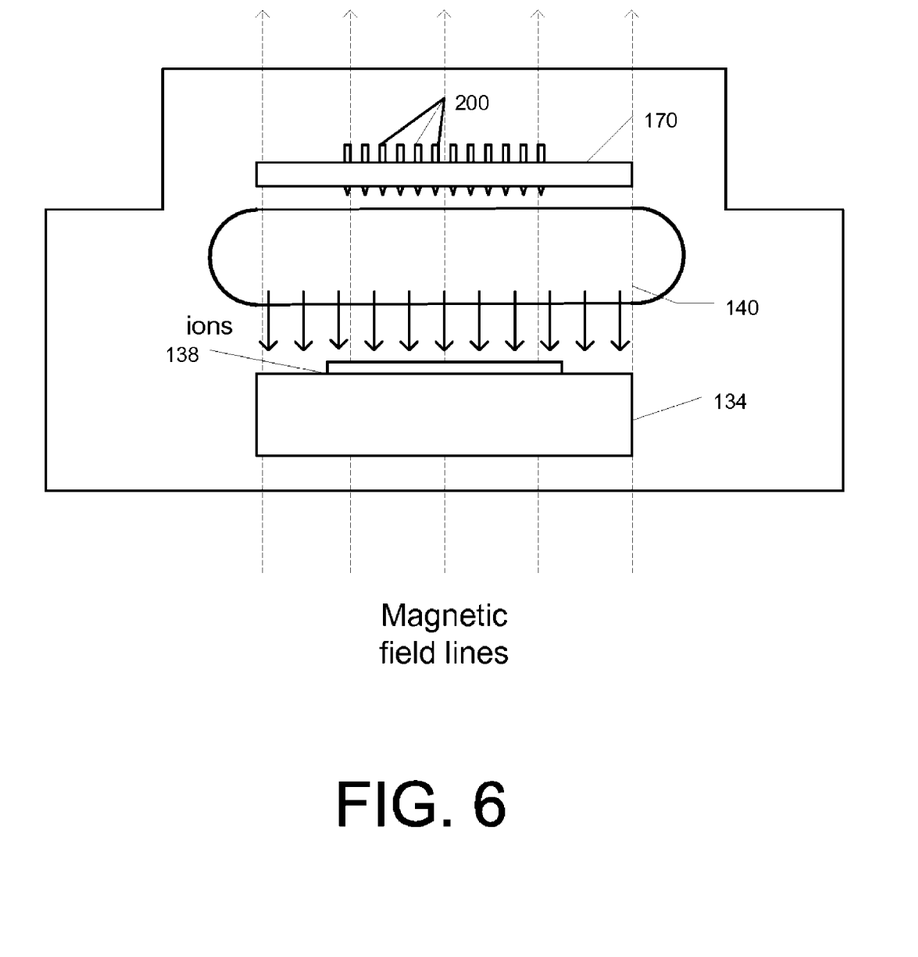
FIG. 6 represents the apparatus of FIG. 2 with an added magnetic field.

In addition to electrical fields, magnetic fields can be added to further improve the plasma uniformity and therefore implant uniformity. In the above embodiment, there was no magnetic field, thus charged particles are free to move in all directions. By introducing a magnetic field parallel to the electrical field, charged particles will be limited in their freedom of motion. Referring to FIG. 6, a magnetic field is added to the apparatus shown in FIG. 2 and is created parallel to the electrical field. In this embodiment, charged particles are more restricted in their movement, in that the charged particles are confined along the magnetic field lines. Thus the effect of the bias voltages described above is more contained. In other words, each electrically conductive element controls the ion concentration of the plasma in the volume located directly below the element. Thus, the bias voltages applied at one element do not affect the ion concentrations in other areas of the plasma.

The magnetic field can be created in a variety of ways, as are known by those skilled in the art. Apparatus and method for improving plasma uniformity in a plasma based system are disclosed. Although the present disclosure has been described herein in the context of particular systems and particular implementations in particular environments for a particular purpose, the present disclosure is not limited thereto. Those of ordinary skill in the art will recognize that its usefulness is not limited thereto and that the present disclosure can be beneficially implemented in any number of environments for any number of purposes. Accordingly, the claims set forth below should be construed in view of the full breadth and spirit of the present disclosure as described herein.

What is claimed is:

1. A plasma processing system, comprising:
   a workpiece disposed in the system;
   a plasma source adapted to generate plasma proximate to said workpiece; and
   a baffle comprising a plurality of electrical conductors, the baffle and the plurality of electrical conductors being positioned such that said plasma is located between said conductors and said workpiece, wherein at least one of said conductors is adapted to be in communication with a power supply capable of creating a bias voltage at said conductor, and wherein at least one of said conductors is an independently biased pin electrode that protrudes from the baffle toward the workpiece.

2. The system of claim 1, further comprising a plurality of power supplies, such that each of said conductors is in communication with one of said plurality of power supplies so as to be capable of having a bias voltage independent of the other conductors.

3. The system of claim 1, further comprising a plurality of power supplies, wherein said plurality of conductors is separated into groups, wherein each of said groups is in communication with one of said plurality of power supplies so as to be capable of having a bias voltage independent of the other groups.

4. The system of claim 1, wherein said conductor is positively biased.

5. The system of claim 1, wherein said conductor is negatively biased.

6. The system of claim 1, wherein said power supply supplies a pulsed bias voltage having a duty cycle.

7. The system of claim 6, wherein said duty cycle is adjustable.

8. The system of claim 1, wherein said baffle is adjustable such that position of said baffle may change relative to said workpiece.

9. The system of claim 1, further comprising means for creating a magnetic field in the same direction as the electric field created by said bias voltage.

10. The system of claim 1, wherein the at least one of said conductors is configured to change distribution of ions in the plasma and to increase uniformity of the plasma generated between said plurality of electrical conductors and the workpiece.

* * * * *